US006813350B2

(12) United States Patent
Ching

(10) Patent No.: US 6,813,350 B2
(45) Date of Patent: Nov. 2, 2004

(54) METHOD AND APPARATUS FOR DETECTING DUAL TONE ALERTING SIGNAL IN TELEPHONE SYSTEMS

(75) Inventor: Philip Ching, Ottawa (CA)

(73) Assignee: Zarlink Semiconductor Inc., Ottawa (CA)

( * ) Notice: Subject to any disclaimer, the term of this patent is extended or adjusted under 35 U.S.C. 154(b) by 737 days.

(21) Appl. No.: 09/729,173

(22) Filed: Dec. 5, 2000

(65) Prior Publication Data

US 2001/0033648 A1 Oct. 25, 2001

(30) Foreign Application Priority Data

Dec. 11, 1999 (GB) ............................................. 9929277

(51) Int. Cl.[7] .......................... H04M 1/00; H04M 9/00; H04M 9/08
(52) U.S. Cl. ............. 379/386; 379/142.01; 379/142.08; 379/142.18
(58) Field of Search ...................... 379/142.01, 93.35, 379/215.01, 201.01, 351, 142.08, 142.18, 386

(56) References Cited

U.S. PATENT DOCUMENTS

| 5,519,774 A | * | 5/1996 | Battista et al. .............. 379/386 |
| 5,612,617 A | | 3/1997 | Waguri ..................... 324/76.45 |
| 5,757,513 A | | 5/1998 | Ikeuchi et al. .............. 358/434 |
| 5,926,541 A | | 7/1999 | Irie | |
| 6,584,194 B1 | * | 6/2003 | Wanner ...................... 379/351 |

FOREIGN PATENT DOCUMENTS

| EP | 0008220 A1 | 2/1980 |
| WO | 79/0006 | 2/1979 |
| WO | WO 99/55096 | 10/1999 |

* cited by examiner

Primary Examiner—Curtis Kuntz
Assistant Examiner—Alexander Jamal
(74) Attorney, Agent, or Firm—Marks & Clerk

(57) ABSTRACT

An apparatus for detecting a dual tone alert signal in a telephone system capable of at least off hook mode operation includes a processing channel for each tone. Each channel consists of a bandsplit filter for extracting the tone of interest and attenuating the other tone; a comparator for comparing the output of said bandsplit filter with a threshold value; and an adaptive threshold generator for generating said threshold value adapted to the amplitude of the output of said bandsplit filter to reject speech and music imitations. The apparatus offers improved talkdown and talkoff immunity.

34 Claims, 8 Drawing Sheets

Figure 9: Timing Section (300) ('cos_digital') Schematic

Figure 10: "Hmono"(302) Schematic

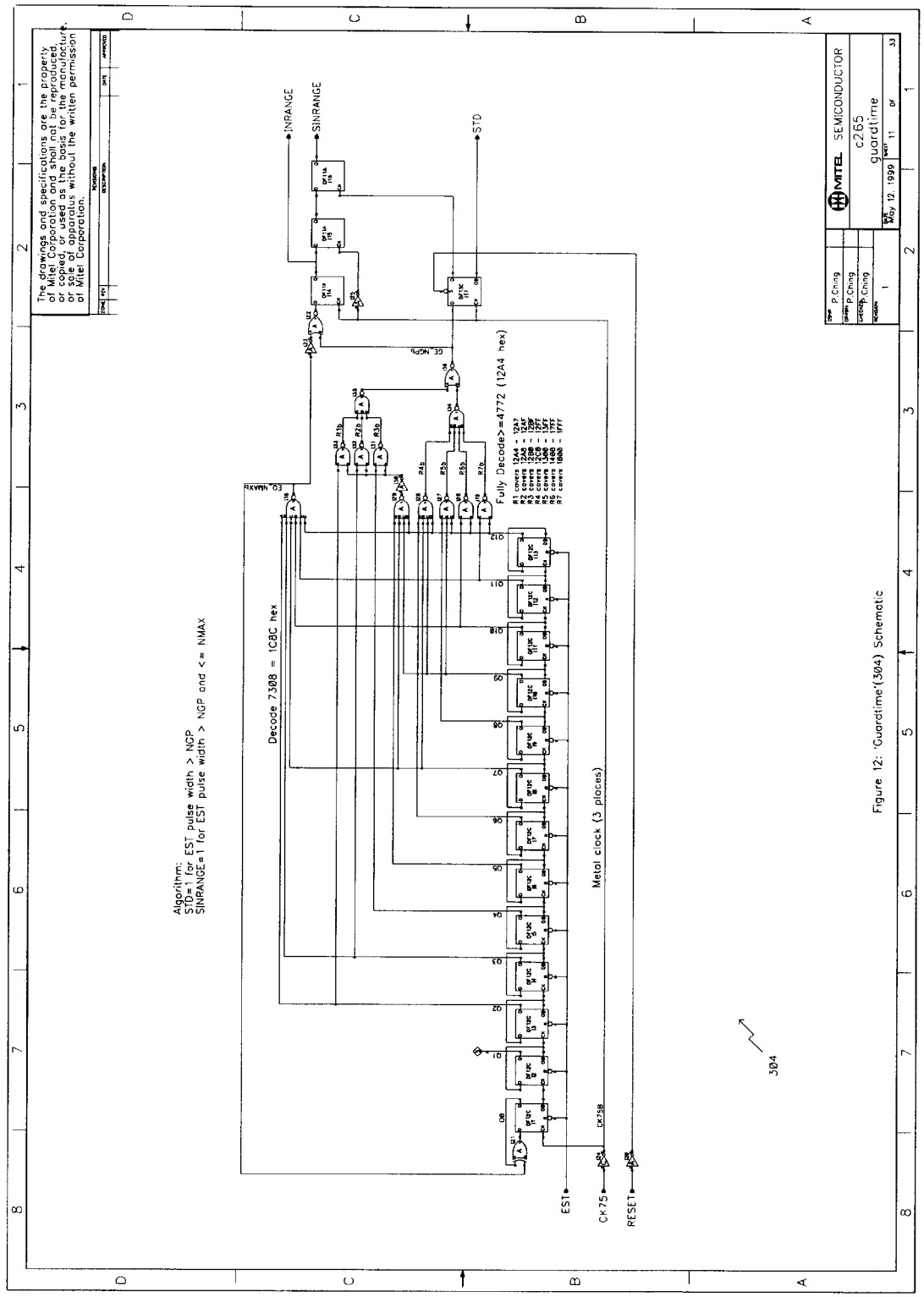

METHOD AND APPARATUS FOR DETECTING DUAL TONE ALERTING SIGNAL IN TELEPHONE SYSTEMS

FIELD OF THE INVENTION

This invention relates the field of telephony, and more particularly to a method and apparatus for detecting a dual tone alerting signal in caller ID systems.

BACKGROUND OF THE INVENTION

Caller ID is the generic name for a group of services offered by telephone operating companies around the world where information about the calling party is transmitted to the called party using FSK (Frequency Shift Keyed) modulation. In the Calling Identity Delivery on Call Waiting (CIDCW) and Call Waiting Deluxe (CWD) services offered by Canadian and U.S. telephone operating companies, a signal is sent by the central office to notify the near end CPE (Customer Premise Equipment), which is already engaged in an established call, that the central office wishes to deliver calling identity information of a waited call. In North America, this signal is known as CAS (CPE Alerting Signal).

CAS is a dual tone signal used for off hook Caller ID signalling. In Europe, a similar signal known as DT-AS (Dual Tone Alerting Signal) is used in off hook and, in some networks, on hook Caller ID signalling.

In off-hook signalling CAS must be detected in the presence of speech, noise or music. Off hook signalling CAS detection must also be robust against imitation from speech, noise, or music because the CPE must be able to detect CAS throughout the entire duration of a call.

The on-hook and off-hook caller id signalling protocol is specified in Bellcore GR-30-CORE, the CPE requirements in SR-TSV-002476. In the off hook protocol, the central office mutes the far end just before the CAS is transmitted. When the near end CPE detects the CAS, it mutes the handset and checks whether there is any parallel off hook CPE. If there is no parallel off hook CPE, it acknowledges CAS reception by sending an ACK signal, which is a predefined DTMF digit, back to the central office. When the central office receives the ACK signal, it transmits the calling party information in FSK to the near end CPE, which then typically displays the information to the user.

Since the CPE is already in an established call, the near end user (the end which is to receive the calling identity information) may be speaking when CAS is transmitted from the central office. Therefore, the CAS must be detected in the presence of near end speech, noise or music. Failure to detect the CAS and reply with ACK within a defined interval is known as 'talkdown'. Talkdown is undesirable because the calling information will not be delivered and the user will not receive the level of service paid for. The user might miss an important incoming call.

Since CAS can be transmitted anytime during the established call, CAS detection must also be robust against imitation from speech, noise or music from both the near end and the far end. A false detection followed by ACK is known as talkoff. Talkoff is annoying because the near end CPE sends a superfluous ACK signal and the near end CPE stays muted in anticipation of the FSK signal.

SR-TSV-002476 specifies CAS detection performance requirements, including talkoff and talkdown immunity requirements. The CAS characteristics are:

Lower tone frequency 2130 Hz+/−0.5%
Upper tone frequency 2750 Hz+/−0.5%
Signal level (per tone) −14 to −32 dBm (referred to 600 ohms)
Signal level differential between tones (Twist) −6 to +6 dB
Duration 75 to 85 ms
Reject signal level (per tone) below −45 dBm In the GR-30-CORE off hook protocol, the near end CPE must not send an ACK signal if there is a parallel off hook CPE. This restriction is modified by a protocol known as MEI (Multiple Extension Interworking) developed by Bellcore in conjunction with the TIA (Telecommunications Industry Association). MEI allows a CPE to ACK if all off hook CPEs are MEI compatible. MEI is described in the TIAEIA-777 standard.

In Europe, the DT-AS characteristics in off hook signalling are similar to CAS, except for minor signal level differences (−9.78 to −32.78 dBm), and that there is no reject level requirement. The on hook signalling DT-AS characteristics are significantly different from CAS for signal levels (−1.78 to −37.78 dBm) and duration (90 to 110 ms), again there is no reject level requirement. The specifications are in the ETSI standards ETS 300 778-1 and ETS 300 778-2. Services similar to CIDCW are offered.

DESCRIPTION OF THE PRIOR ART

FX602 Data sheet and U.S. Pat. No. 5,649,002 disclose a method wherein a determination is made whether the CAS detect signal remains in a predetermined condition at a predetermined time after the local telephone signal is suppressed. A validity signal is output when the CAS detect signal remains in the predetermined condition at the predetermined time. False detections are thereby minimized by ignoring detections caused by a signal originating at the local telephone. This method is undesirable because the speech check mutes employed are annoying to near end and far end users.

U.S. Pat. No. 5,519,774 discloses an apparatus with two channels for separately detecting each tone. Each channel includes means for comparing the signaling energy around one of the tones with the energy in a selected weighted guard band portion of the voiceband. Based on this comparison, a determination is made whether a tone is or is not present. A pulse signal formed from the coincidences of tone detection in each channel is used by timing circuitry to determine whether the dual tone alerting signal is actually present or whether speech energy caused both tones to be erroneously detected (talkoff). Characteristics of this pulse signal are analyzed to determine whether an alerting signal is present. An alerting signal is detected if parameters of these characteristics fall within determined ranges, which ranges are continuously updated based on the parameters of these signal characteristics determined from previously detected alerting signals. If, however, the signal characteristic parameters of a present potential alerting signal match those of a previously determined talkoff signal, a talkoff is presumed even when these parameters fall within ranges in which an alerting signal would otherwise be detected.

This apparatus is difficult to manufacture in analog implementation because of the stringent post limiter filter −3 dB frequency requirements. It is expensive for DSP implementation because the stringent post limiter filters will require long word length. Additionally, the post limiter filter −3 dB frequencies are just barely sufficient to detect tones which are at the −0.5% or +0.5% frequency extreme of the SR-TSV-002476 requirement and leave no room for manufacturing variation and component tolerance.

SUMMARY OF THE INVENTION

According to the present invention there is provided an apparatus for detecting a dual tone alert signal in a telephone system capable of at least off hook mode operation comprising a processing channel for each tone, each processing channel comprising a bandsplit filter for extracting the tone of interest and attenuating the other tone; a comparator for comparing the amplitude of the output of said bandsplit filter with a threshold value; and an adaptive threshold generator for generating said threshold value adapted to the amplitude of the output of said bandsplit filter such that the comparator rejects speech and music imitations of the tone.

The dual tone alert signal may, for example, be a CAS signal or a DT-AS signal.

The apparatus may be selectable between 'off hook mode' and 'on hook mode' operations. Off hook mode is optimized for both talkoff and talkdown immunity, while on hook mode is optimized for better talkdown immunity.

Off hook mode can be used in off hook signalling CAS detection when the CPE with the invention is in the off hook state. On hook mode can be used in off hook signalling CAS detection when a parallel CPE is off hook but the CPE is in the on hook state, such as in MEI. The following description explains why on hook mode only needs to be talkdown robust.

MEI introduces the concept of the ACK Sender and Backup ACK Sender. On a per call basis, the ACK sender is the first CPE to go off hook for the call. It retains its status even if it returned on hook while the line remains off hook. The ACK sender must give up its status if a Type 3 CPE asserts its ACK Sender status.

The Backup ACK Sender is the CPE to last respond to CAS with an ACK and successfully receive FSK data. It retains its status from call to call but must give up its Backup ACK Sender status when another CPE successfully completes the CAS-ACK-FSK sequence.

Therefore an MEI compatible CPE must be able to detect CAS when itself is on hook but the line is off hook. In most CPE designs, to detect CAS when the CPE is on hook the signal must come from the Tip/Ring connection because the 4-wire side connection (to the receive pair of the telephone hybrid or speeech IC) is not operational, or the 4-wire side signal level is severely attenuated.

When the CPE is on hook (while the line is off hook), its CAS detector only needs to be talkdown immune because of the MEI CAS-ACK protocol. For the purpose of this invention, in MEI when CAS is detected:

Each off hook CPE must proceed to the on hook state not earlier than 25 ms and no later than 60 ms after the end of CAS as measured on Tip/Ring. After detecting a line HIGH state (the line voltage when the line is not terminated by any CPE), the ACK Sender (which may be on hook when the CAS came) goes off hook. The ACK sender allows the line to remain in the HIGH state for at least 8 ms but not more than 8 ms. If no line HIGH state is detected within 100 ms after going on hook, all previously off hook CPE shall return to the off hook state.

Following a CAS event, the Backup ACK Sender (which may be on hook when the CAS came) monitors the line for a line HIGH state lasting a minimum of 15 ms. Once this condition has been detected, the Backup ACK Sender shall immediately become the ACK Sender, go off hook no later than 20 ms after the start of the line HIGH state, complete the CAS-ACK handshake, and remain as ACK Sender for the remainder of the call. This situation may happen if the designated ACK Sender is not MEI compliant.

An MEI compliant CPE that is not the designated ACK Sender or the Backup ACK Sender but which is off hook at the time of the CAS, must monitor the line for a line HIGH state lasting a minimum of 30 ms. Once this condition has been detected, the CPE shall immediately become the ACK Sender, go off hook no later than 35 ms after the start of the line HIGH state, complete the CAS-ACK handshake, and remain as ACK Sender for the duration of the call. This situation can happen if the designated ACK Sender and the Backup ACK Sender are not MEI compliant.

After going off hook the ACK Sender begins transmission of the ACK no earlier than 30 ms and no later than 40 ms after the leading edge of the line HIGH voltage transition.

The on hook CPE's (ACK Sender or Backup ACK Sender) CAS detector does not need to be talkoff robust because after CAS has been detected, the CPE must monitor the line for the line HIGH state, which can happen only if an off hook CPE also detected CAS.

However, the on hook CPE's CAS detector must be talkdown robust. Otherwise it will miss the CAS even though the off hook CPE detected the CAS. The on hook mode can also be used to detect the ETSI on hook signalling DT-AS.

The invention also provides a method of detecting a dual tone alert signal in a telephone system capable of at least off hook mode operation comprising the steps of for each tone, extracting the tone of interest and attenuating the other tone; and comparing the level of each extracted tone with a threshold value adapted to the amplitude of the output of said bandsplit filter so as to reject speech and music imitations.

BRIEF DESCRIPTION OF THE DRAWINGS

The invention will now be described in more detail, by way of example only, with reference to the accompanying drawings, in which:

FIG. 12 is a block diagram of a detail of the timing circuit.

Referring now to FIG. 1, this shows an input arrangement typically used in a single chip Caller ID receiver. In a conventional design, for MEI applications the signal from the Tip/Ring front end amplifier 2 is selected when the CPE is on hook while the line is off hook. The signal from the telephone hybrid/speech IC front end amplifier 4 is selected when the CPE is off hook to take advantage of the near end speech attenuation provided by the telephone hybrid/speech integrated circuit.

To take advantage of the better on hook mode talkdown immunity, the input to the CAS detector 100 is normally selected to come from the Tip/Ring front end amplifier 2 for on hook mode CAS detection. In the off hook mode, in one embodiment the input comes from either the Tip/Ring front end amplifier 2 or the telephone hybrid/speech IC front end amplifier 4; in another embodiment input comes from the telephone hybrid/speech IC front end amplifier 4.

Figure 1:
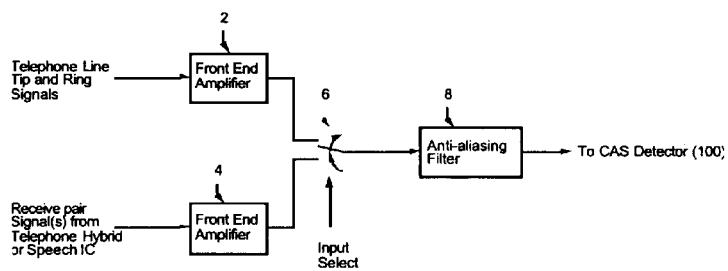
FIG. 1 is a block diagram of a CAS input arrangement.
Figure 2:
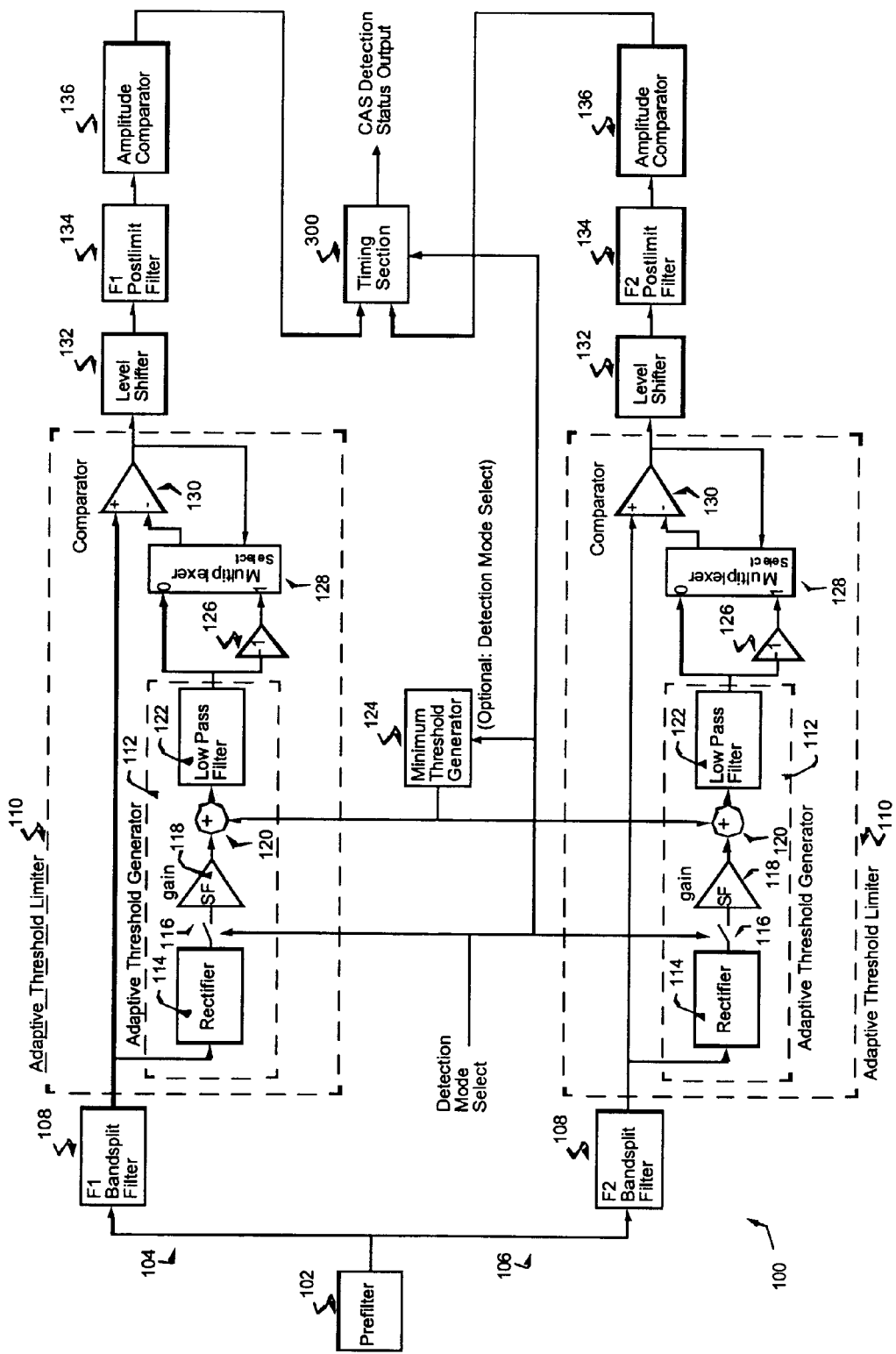
FIG. 2 is a block diagram of a CAS detector in accordance with the principles of the invention.

A block diagram of the CAS detector 100 is shown in FIG. 2. In an analog implementation, the CAS detector input signal typically comes from the output of the circuit shown in FIG. 1. In a DSP implementation, the input signal is the output of the circuit shown in FIG. 1 digitized by an analog-to-digital converter. The output 'CAS Detection Status' is a logic signal which indicates whether CAS has been detected. A logic signal 'Detection Mode Control' puts the detector into 'off hook mode' or 'on hook mode'.

Figure 3:
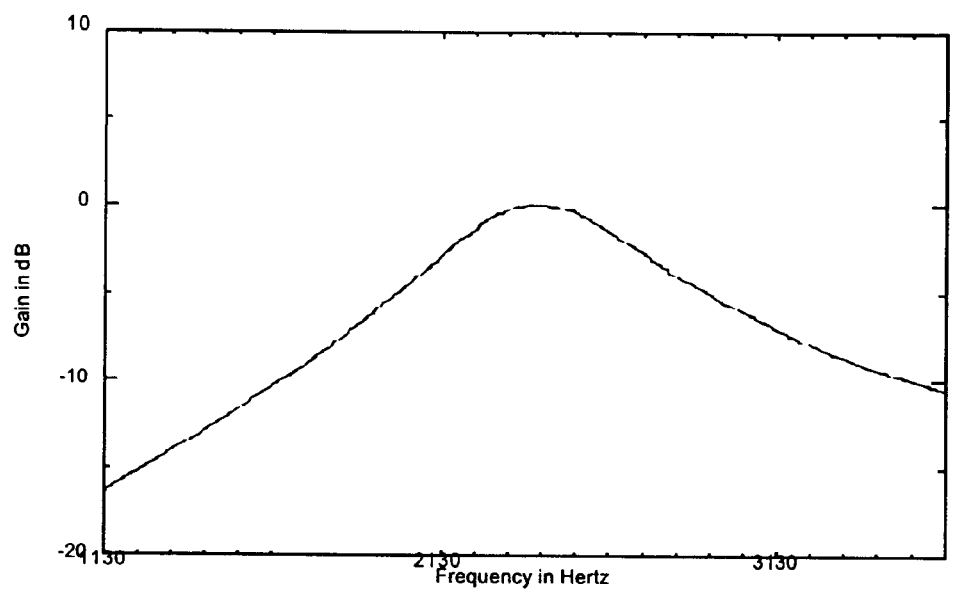
FIG. 3 shows the frequency response of a prefilter.

The input signal is processed by a prefilter 102. The prefilter 102 is a bandpass filter which has equal gains at the upper and lower tone frequencies, 2750 and 2130 Hz. Frequencies between the upper and lower tone frequencies are amplified as shown in FIG. 3. The increased gain in the band between the lower and upper tone frequencies provides protection against imitation from speech and music. To produce an imitation, the speech or music must contain, for example, a 7th and a 9th harmonic at or close to the lower and upper tone frequencies respectively. Another possibility is for the speech or music to contain a 10th and a 13th harmonic at or close to those frequencies. Other harmonic combinations are also possible, such as 17th and 22nd. The prefilter amplifies the 8th harmonic in the 7th and 9th case, the 11th and 12th in the 10th and 13th case, etc, so that the amplified harmonics interfere more with those at the lower and upper tone frequencies to protect against imitations.

The output of prefilter 102 is processed by two channels 104 and 106. One channel provides detection of the upper tone, the other the lower tone. The two channels are architecturally equivalent.

Figure 5:
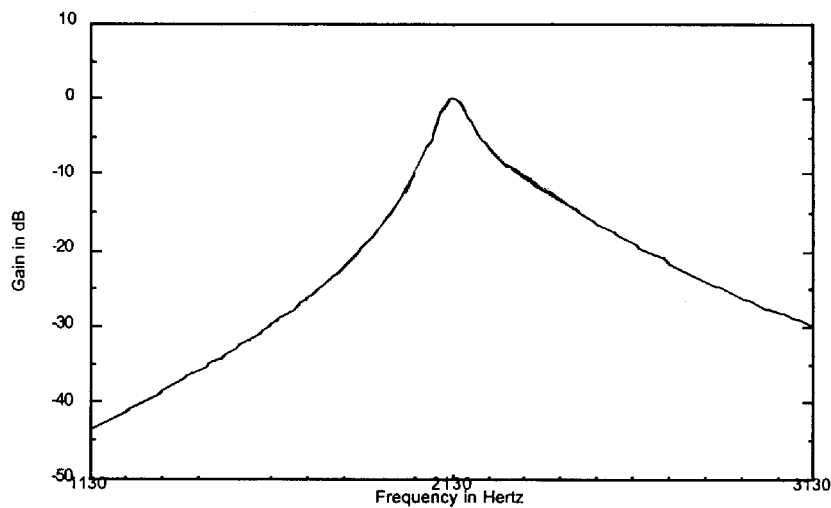
FIG. 5 shows the frequency response of a cascaded prefilter and 2130 Hz bandsplit filter.
Figure 4:
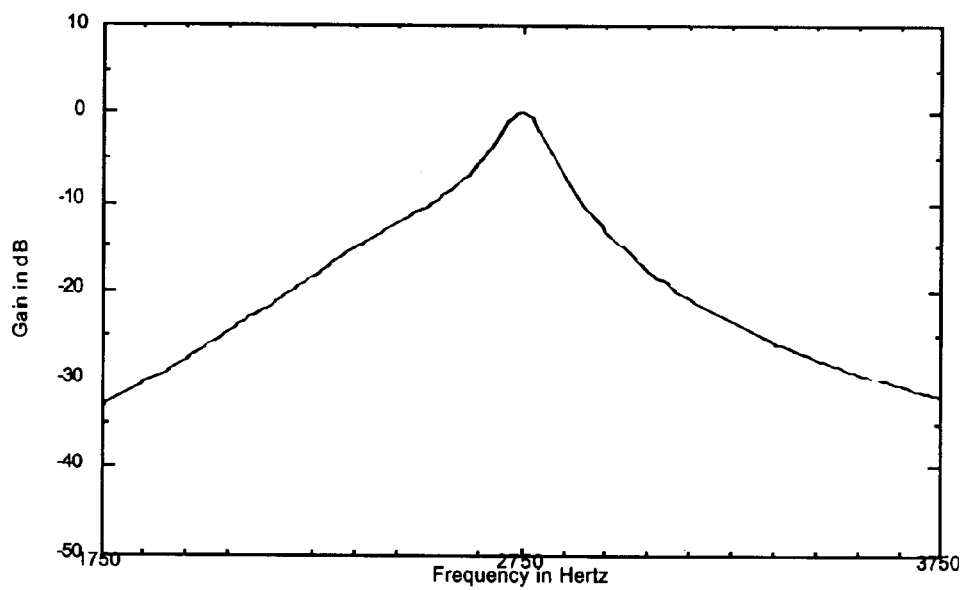
FIG. 4 shows the frequency response of a cascaded prefilter and 2750 Hz bandsplit filter.

In each channel, a bandsplit filter 108 extracts the tone of interest and attenuates the other tone. The bandsplit filter provides only limited attenuation for the other tone as shown in the cascaded prefilter 102 and bandsplit filter 108 gain frequency responses in FIGS. 4 and 5. The purpose is to improve talkoff. A legitimate CAS has a bounded signal level differential between the two tones. This is not so for speech or music. By attenuating the other tone only a limited amount, speech or music which imitates CAS but has a large signal level difference at the CAS frequencies will have a larger residue at the bandsplit filter output than a legitimate CAS.

The bandsplit filter output is processed by an adaptive threshold limiter 110 consisting of adaptive threshold generator 112, unity gain inverting amplifier 126, multiplexer 128 and comparator 130.

It will be apparent to a person skilled in the art that many variations of the adaptive threshold generator 112 are possible. The configuration in FIG. 2 will be used to illustrate the operating principle.

The adaptive threshold generator operates differently in off hook mode and on hook mode. In off hook mode, the adaptive threshold generator 112 produces a threshold which adapts to the amplitude of the bandsplit filter 108 output. The bandsplit filter output is rectified by rectifier 114. The switch 116 is closed so that the rectifier output is amplified SF times (SF=scale factor) by amplifier 118, added by summer 120 to a time invariant DC level (minVth) generated by minimum threshold generator 124, then filtered by low pass filter 122. The amplifier 118 and low pass filter 122 can be part of a single circuit, which can also include the summer 120.

The rectifier 114 can be a full wave or half wave rectifier. The rectifier can also be non-inverting or inverting. The choices are according to implementation convenience. A non-inverting rectifier will be used to illustrate the principle. If it is full wave, positive signals will pass through unchanged, while negative signals will be inverted about signal ground. If it is half wave, positive signals will pass through unchanged, while the rectifier output will be clamped to signal ground for negative signals. If it is full wave, for an input sine wave of amplitude A, the rectifier output contains a DC component of amplitude $2A/\pi$. If it is half wave, the rectifier output DC component amplitude is $A/\pi$ and the amplifier 118 will need twice the gain as the full wave case. The AC components of the rectifier 114 output will be removed by the low pass filter 122.

The minimum threshold (minVth) from the minimum threshold generator 124 is a time invariant DC signal so it doesn't really need to be low pass filtered. It is processed as shown in FIG. 2 because of implementation economy: the amplifier 118, summer 120 and low pass filter 122 can be implemented as a summing low pass filter with gain SF for the path from the rectifier 114.

For a sine wave with amplitude A at the bandsplit filter 108 output, the adaptive threshold generator 112 output is $(2A*SF/\pi)+minVth$. For high level bandsplit filter output $(2A*SF/\pi>>minVth)$, the adaptive threshold is primarily based on the sine wave amplitude A. For low level bandsplit filter output, the adaptive threshold is primarily based on the time invariant minVth set by the minimum threshold generator 124. The tone reject level is when the sine wave amplitude A equals the adaptive threshold: $A=minVth/(1-2*SF/\pi)$. For example, if SF=0.55, then for large A, the adaptive threshold is 0.3501A; for small A, if SF=0.55, minVth=8.70 mV and A=27.5 mV, the adaptive threshold is 18.3 mV or 0.666A; if SF=0.55 and min Vth=8.7 mV, the reject level is 13.39 mV.

The low pass filter −3 dB frequency is set very low (tens of Hertz) so that the adaptive threshold tracks the average amplitude of the bandsplit filter output. The low −3 dB frequency provides talkoff protection: typically speech has varying amplitudes where the instantaneous amplitudes can dip below the average, whereas a legitimate CAS will have a relatively constant amplitude, which will always be greater than the threshold. So if the instantaneous amplitude falls below the average value, it is likely that the signal is not a tone.

The minimum threshold from minimum threshold generator 124 is chosen based on computer simulation with speech signals so that low level speech is rejected and won't cause talkoff.

In on hook mode, the switch 116 in the adaptive threshold generator 112 is opened and the input to the amplifier 118 is switched to signal ground. The low pass filter 122 output is the time invariant DC minVth from the minimum threshold generator 124. By changing to a fixed threshold, talkdown immunity is improved when the CAS detector operates in on hook mode.

As an option, in on hook mode the minimum threshold from minimum threshold generator 124 can be changed to be different from that used in off hook mode to improve detect level margin for minimum level European DT-AS detection.

The operation of the adaptive threshold limiter 110 will now described in more detail. In FIG. 2, the output of the adaptive threshold generator 112 is positive with respect to signal ground. For the purpose of description it is called the positive threshold. The unity gain inverting amplifier 126 inverts the positive threshold with respect to signal ground to produces a voltage called the negative threshold. To switch the comparator 130, the amplitude of the signal at the bandsplit filter 108 output must be greater than the adaptive threshold.

When the comparator 130 output is logic 0, the multiplexer 128 '0' input is selected and the positive threshold is applied to the comparator '−' terminal. To change the comparator output from logic 0 to 1, the bandsplit filter 108 output must transition above the positive threshold. The comparator 130 output changes to logic 1 and applies the negative threshold at the '1' input of multiplexer 128 to the comparator '−' terminal. To change the comparator output from logic 1 back to 0, the bandsplit filter 108 output must transition below the negative threshold. In an analog implementation, logic 1 corresponds to the positive power supply voltage, logic 0 corresponds to the negative power supply voltage. Therefore, for a sine wave extracted by the bandsplit filter 108 whose amplitude is greater than the adaptive threshold, the adaptive threshold limiter 110 output is a square wave whose period is the same as that of the sine wave.

For implementations where the adaptive threshold generator 112 output is negative, the '1' and '0' inputs to the multiplexer 128 should be reversed and the adaptive threshold limiter 110 will operate as described.

The Fourier components of a square wave with peak to peak swing A is $Cn=2A/(n\pi)$ for odd n, 0 for even n. If the square wave is filtered to remove all components except the fundamental (i.e. n=1), the result will be a sine wave of amplitude $2A/\pi$. Additionally, if the filter is a high Q bandpass filter with 0 dB peak gain, then only a square wave at the peak gain frequency will produce a sine wave of amplitude $2A/\pi$. Square waves at deviated frequencies will be attenuated by the bandpass filter. By looking at the signal amplitude at the bandpass filter output, one can determine whether the input square wave frequency falls within a desired range. These functions are provided by the level shifter 132, postlimit filter 134 and amplitude comparator 136.

Figure 6:
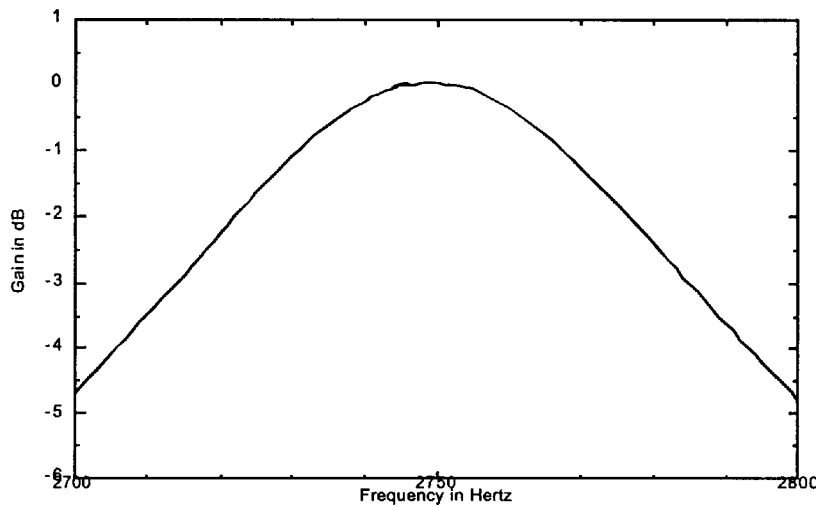
FIG. 6 shows the frequency response of a 2750 Hz postlimit filter.
Figure 7:
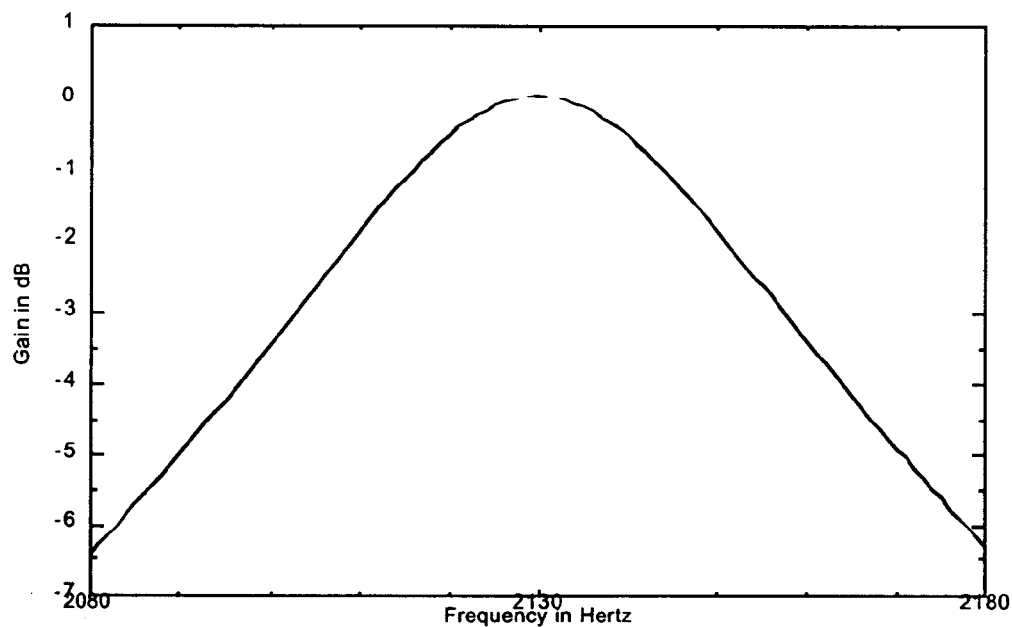
FIG. 7 shows the frequency response of a 2130 Hz postlimit filter.

The postlimit filter 134 is a high Q bandpass filter whose peak gain (0 dB) is at the nominal frequency of the channel. The gain frequency responses of the postlimit filters of the two channels are shown in FIGS. 6 and 7.

The level shifter 132 translates the logic output of the adaptive threshold limiter 110 to voltage levels suitable for the postlimit filter 134. In an analog implementation, logic 1 corresponds to the positive power supply voltage, logic 0 corresponds to the negative power supply voltage. Signal ground is midway between the positive and negative power supply voltages. For convenience, Vdd will be defined as the voltage difference between the positive and negative power supplies. Since signal ground is midway, the maximum permissible signal amplitude at the postlimit filter output is 0.5Vdd. If the adaptive threshold limiter 130 output is applied directly to the postlimit filter 134 which has a 0 dB gain peak, at the gain peak frequency the sine wave amplitude will be $2Vdd/\pi=0.6366Vdd$, which exceeds the maximum permissible amplitude.

In this implementation, the level shifter 132 maps adaptive threshold limiter 110 output logic 1 to the positive power supply, logic 0 to signal ground. That is, the level shifter output peak to peak swing is 0.5Vdd. At the gain peak frequency, the sine wave amplitude at the postlimit filter output is $Vdd/\pi=0.3183Vdd$ which is less than the maximum permissible amplitude at the postlimit filter output.

Figure 8:
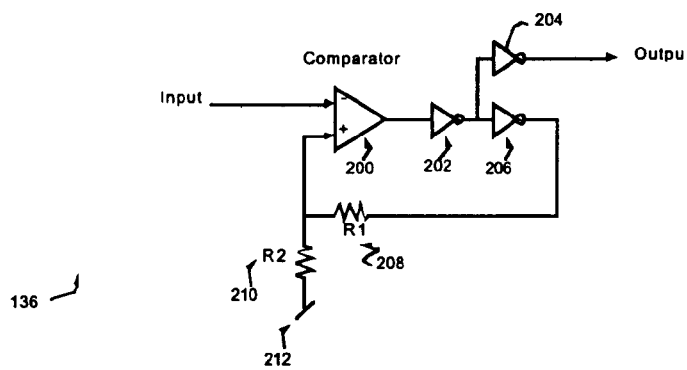
FIG. 8 is a circuit diagram of an amplitude comparator.

It will be apparent to a person skilled in the art that many designs of the amplitude comparator 136 are possible. An exemplary implementation is shown in FIG. 8. For a periodic input signal of sufficient amplitude, comparator 136 produces a square wave output. Otherwise, the output remains at the last state it transitioned into. It consists of comparator 200, inverters 202, 204 and 206, resistor R1 208, resistor R2 210, and signal ground 212. The inverter 206 output logic state follows that of the comparator 200 and is either logic 1 or 0. The inverter 206 output voltages for logic '1' and '0' are the positive and negative power supply voltages respectively. That is, with respect to signal ground 212, the inverter 206 output is 0.5Vdd for logic '1', −0.5Vdd for logic '0'.

The input signal amplitude required to change the comparator 200 output is set by the resistors 208 and 210 (R1 and R2). When the comparator 200 output is logic 1, the compare threshold is $R2/(R1+R2)*0.5Vdd$ with respect to signal ground. To change the comparator output to logic 0, the input signal must transition to above the compare threshold. When the comparator output is logic 0, the compare threshold is $-R2/(R1+R2)*0.5Vdd$ with respect to signal ground. To change the comparator output to logic 1, the input signal must transition to below the compare threshold.

In this implementation, the ratio $R2/(R1+R2)$ is set such that at the postlimit filter 134 input, a square wave whose frequency is between the lower −3 dB frequency and the upper −3 dB frequency of the postlimit filter frequency response will generate a square wave of the same period at the amplitude comparator 136 output: R1 208 is 11 units, R2 210 is 9 units. The magnitude of the threshold is 0.225Vdd which is 3 dB below 0.3183Vdd.

Figure 9:
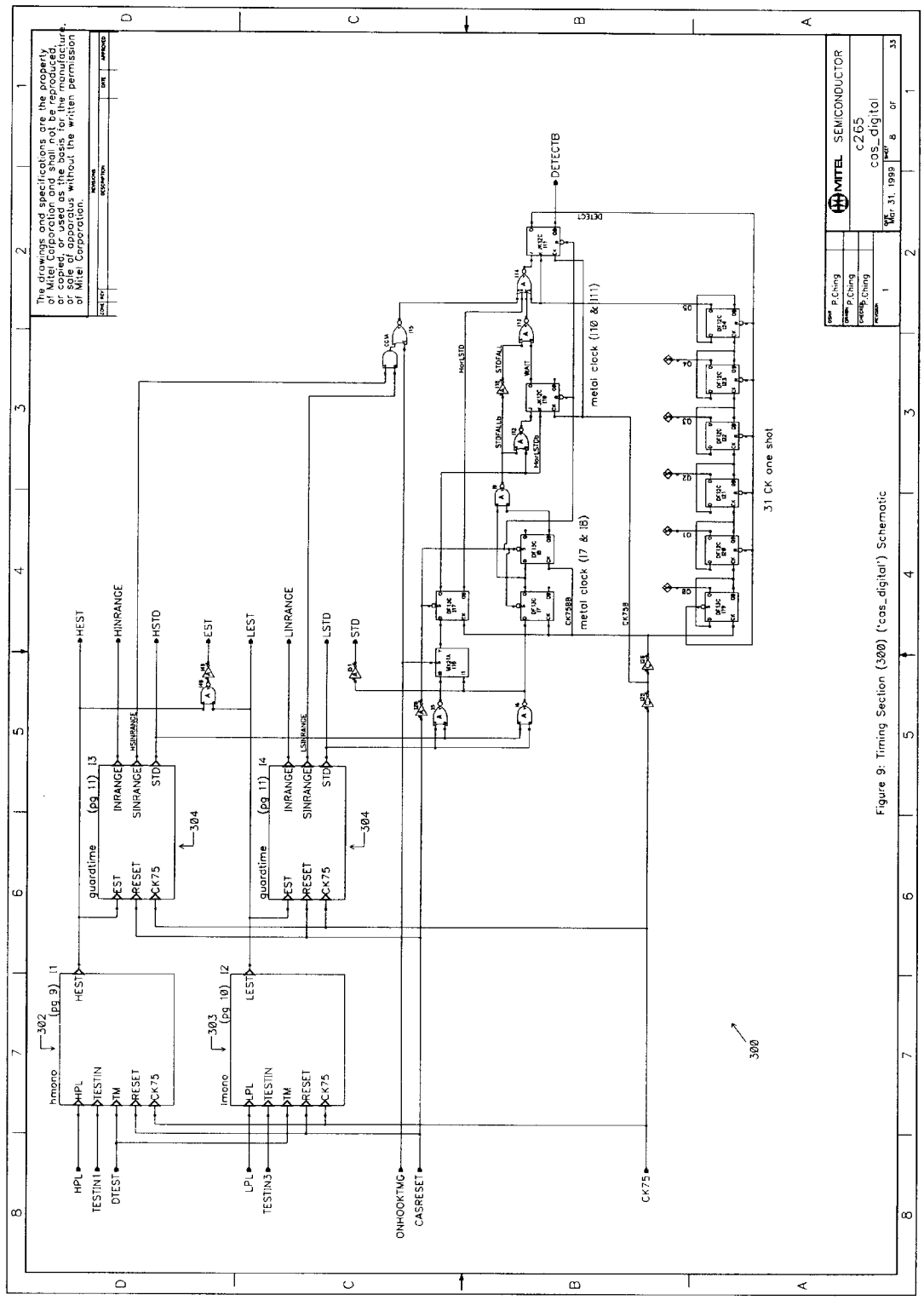
FIG. 9 is a block diagram of the timing section of a CAS detector.

The timing section 300 is shown in the digital circuit schematic in FIG. 9. It contains a 'hmono' 302 block, 'lmono' 303 block, two 'guardtime' 304 blocks, shown in more detail respectively in FIGS. 10, 11 and 12, and some logic gates. The signal HPL corresponds to the amplitude comparator 136 output of the 2750 Hz channel, the signal LPL corresponds to the amplitude comparator 136 output of the 2130 Hz channel. During operation, the input signals DTEST and CASRESET are set to logic 0, input signals TESTIN1 and TESTIN3 are don't cares. ONHOOKTMG selects 'on hook mode' operation when it is logic 1, 'off hook mode' operation when it is logic 0. CK75 is a clock signal at 74574 cycles per second. In a switched capacitor or DSP implementation, CK75 is synchronous with the switched capacitor or digital filters in FIG. 2.

The signal DETECTB is the timing section 300 output. It goes low for 31 CK75 cycles to indicate that CAS has been detected. The number of CK75 cycles DETECTB is low is a system design choice, and is immaterial to the operation of the CAS detector. The other output signals HEST, HINRANGE, HSTD, EST, LEST, LINRANGE, LSTD, STD are for manufacturing testing or are intermediate signals.

In the following description, logic 1 is just 1 or high, logic 0 is just 0 or low.

The amplitude comparator 136 output is a square wave whose period is the same as the period of the extracted tone.

Figure 10:
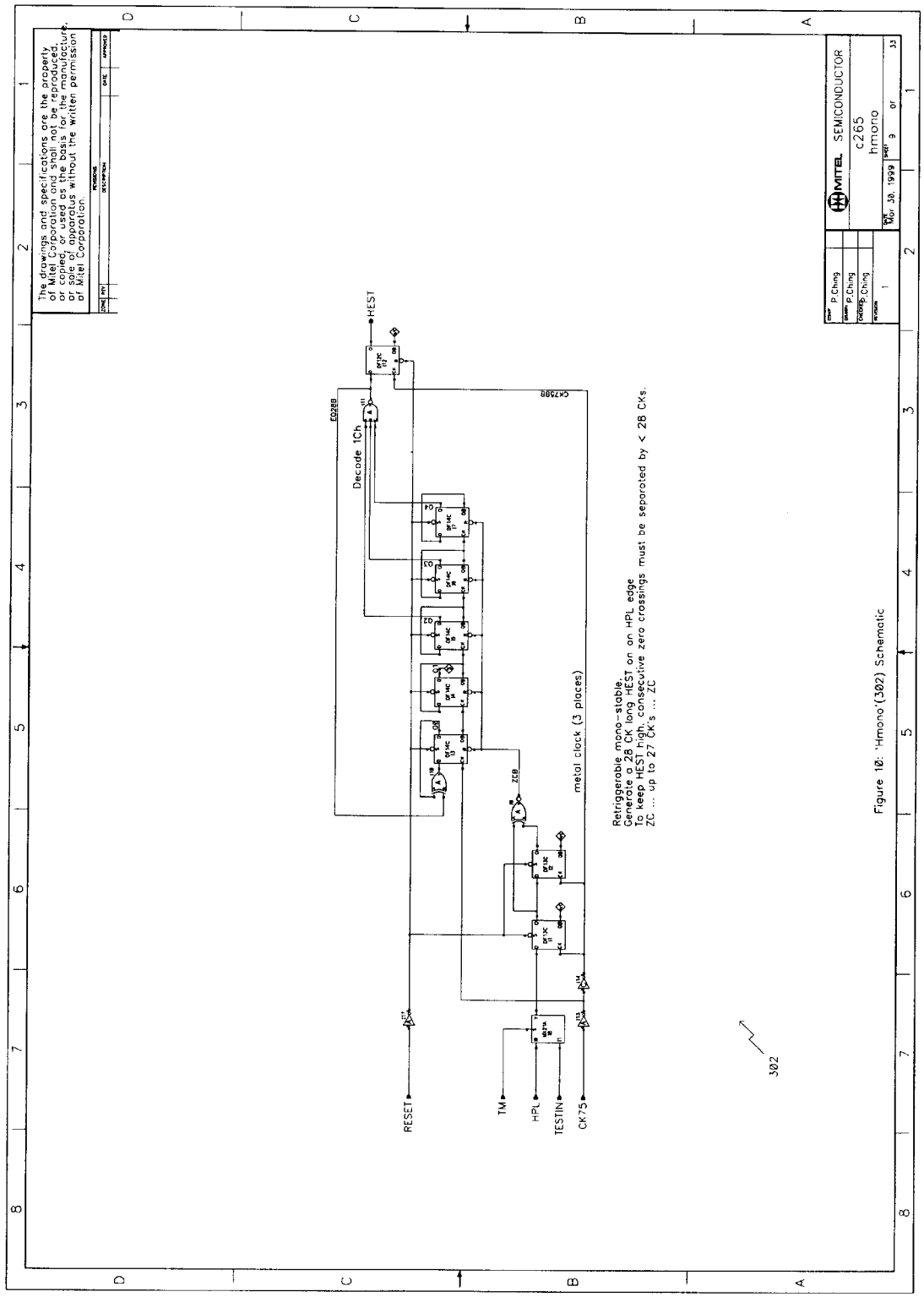
FIG. 10 is a block diagram of a detail of the timing circuit.
Figure 11:
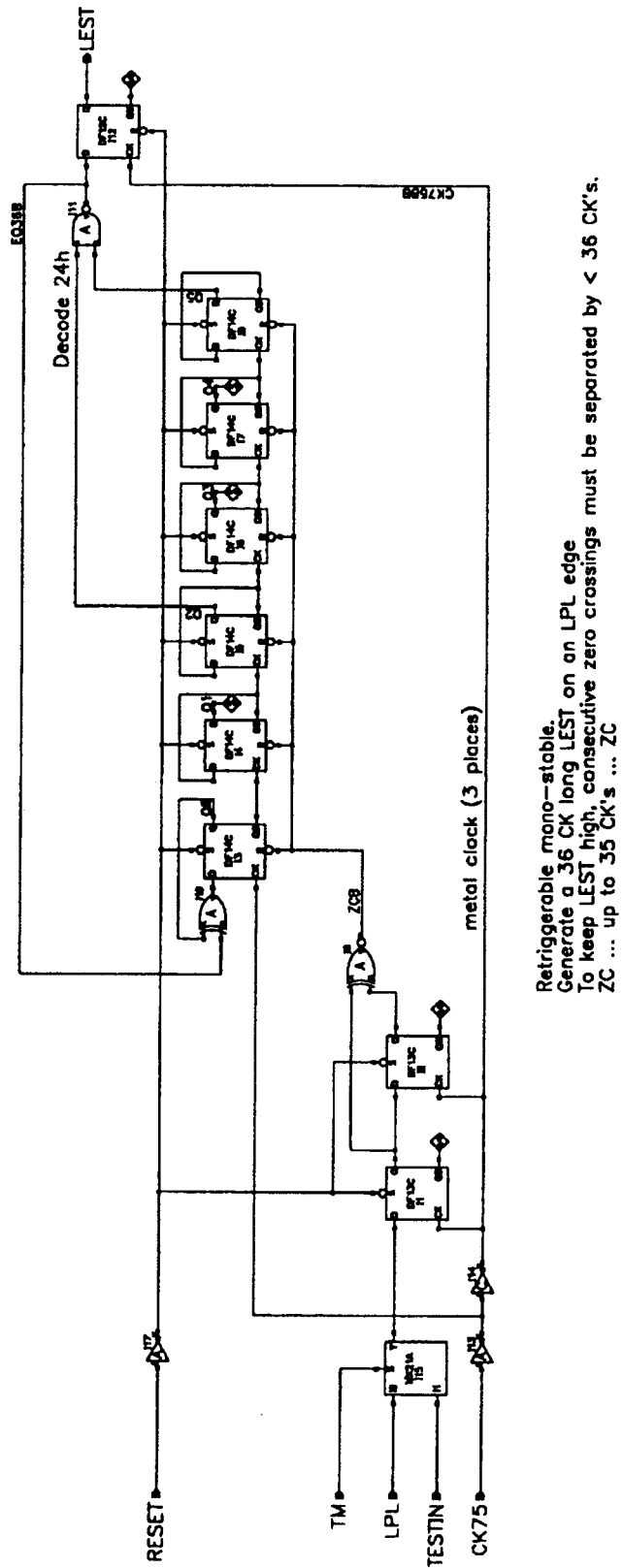
FIG. 11 is a block diagram of a detail of the timing circuit.

The 'hmono' 302 circuit, shown in more detail FIG. 10, performs a hold-over function so that for as long as there is a square wave at the upper tone amplitude comparator 136 output HPL, the 'hmono' output HEST is high. Thus the HEST high duration is the 'on' duration of the upper tone. The 'lmono' 303 circuit performs the same function for the lower tone, the output is LEST. The LEST high duration is the 'on' duration of the lower tone.

In off hook mode, the adaptive threshold in adaptive threshold generator 112 also reduces the difference of HEST (and LEST) 'on' time between high and low level signals. The reduced variation improve talkdown immunity.

'hmono' 302 (FIG. 10) operates as the digital equivalent of a retriggerable monostable multi-vibrator. It is triggered by a low to high or high to low transition of the sampled HPL signal. Once it has been triggered, the output HEST goes high. As long as it is retriggered within a defined interval, HEST stays high. After the last trigger (i.e. the tone ceases to be detected), HEST goes back to low after the interval has expired. For a detected tone, there should be two transitions every tone period. The retrigger interval is chosen to be slightly over an upper tone period. 'lmono' 303 (FIG. 11) operates in the same way except that the retrigger interval is slightly over a lower tone period. The retriggerable monostable multivibrator serves to convert a square wave input into a pulse signal whose pulse width corresponds to the duration of the candidate tone.

Once a tone has been detected, the 'on' duration must meet a minimum requirement. In off hook mode, the 'on' duration must also meet a maximum requirement. These functions are provided by the 'guardtime' 304 circuit in FIG. 12, which serves to determine whether the duration of the candidate tone falls within a specified range. Each channel is processed separately. In FIG. 12, the signal STD goes high after the tone 'on' indicator (signal EST in FIG. 12) has been continuously high for a minimum duration. Thereafter STD stays high as long as EST stays high. When the tone ceases to be detected, EST goes low and STD goes low. At the STD falling edge, the status of whether the on duration was between the minimum (64 ms) and maximum (98 ms) is stored as the signal SINRANGE.

The logic gates in FIG. 9 form the CAS detect decision circuit. It operates in 'off hook mode' and 'on hook mode' selected by the ONHOOKTMG signal. The output DETECTB goes low for 31 CK75 cycles to indicate that CAS has been detected.

In off hook mode the criteria for a valid detection are:
1) The 'on' duration of the tones must overlap for greater than or equal to 64 ms.
2) Each tone's 'on' duration must be greater than or equal to 64 ms and less than or equal to 98 ms.

The first criterion is met if the signal STD in FIG. 9 goes high (STD=HSTD & LSTD). It is not necessary to detect the STD 0 to 1 transition but when STD changes from 1 to 0, a flag (signal WAIT) is set. If the flag is set, then after both HSTD and LSTD have returned low (i.e. after the later one of the two has returned low), if the second criterion is also met then a CAS has been detected.

The off hook mode decision logic can be represented by the following pseudo-code which is executed once every CK75 cycle:

Define signals
   STD=HSTD & LSTD (logical and)
   HorLSTD=HSTD|LSTD (logical or)
   STDFALL=~STD & STD_last If (STDFALL==1) and (HorLSTD==0) (i.e. Both HSTD and LSTD return from 1 to 0 at the same time)
   If (HSINRANGE==1) and (LSINRANGE==1), CAS Detected. (decide whether the second criterion is met)
If (STDFALL==1) and (HorLSTD==1) (i.e. HSTD and LSTD do not return from 1 to 0 at the same time)
   WAIT=1 (set WAIT flag)
If (WAIT==1) and (HorLSTD==0) (i.e. WAIT was set by STD going from 1 to 0 and now both HSTD and LSTD have returned to 0)
   If (HSINRANGE==1) and (LSINRANGE==1), CAS Detected. (decide whether the second criterion is met)
If (HorLSTD==0)
   WAIT=0 (clear wait flag)
STD_last=STD In on hook mode there is only 1 criterion for a valid detection:
   The 'on' duration of the tones must overlap for greater than or equal to 64 ms.
In on hook mode, CAS is detected when the signal STD in FIG. 9 goes from high to low.

The circuit described permits optimization of both talkoff and talkdown immunity for off hook mode CAS detection using an adaptive threshold in adaptive threshold limiter 110, and off hook mode timing in timing section 300.

The circuit is optimized for better talkdown immunity for on hook mode CAS detection using a time invariant DC threshold in adaptive threshold limiter 110, and on hook mode timing in timing section 300.

To improve talkoff, prefilter 102 boosts frequencies between 2130 and 2750 Hz and bandsplit filters 108 attenuate the other tone by only a limited amount.

To improve talkoff, in off hook mode the adaptive threshold limiter 110 rejects signals which have amplitudes that dip below the average amplitude.

In the off hook mode, the adaptive threshold generator 112 sets the threshold according to the average speech level when speech level is high to improve talkoff immunity against high level speech, and sets threshold according to a preset minimum threshold when speech level is low to improve low level talkoff immunity.

In the off hook mode, the adaptive threshold in adaptive threshold generator 112 also reduces the difference of HEST (and LEST) 'on' time between high and low level CAS. The reduced variation improves talkdown immunity.

As an option, in on hook mode the minimum threshold from minimum threshold generator 124 can also be changed to be different from that used in off hook mode to improve detect level margin for minimum level European DT-AS detection.

What is claimed is:

1. An apparatus for detecting an alert signal containing first and second tones in a telephone system capable of caller id off hook mode operation, said apparatus comprising:
   a) a first processing channel comprising:
      (i) a bandsplit filter for passing said first tone and providing limited attenuation of said second tone;
      (ii) a first comparator for comparing the output of said first bandsplit filter with a first varying threshold value to reject speech and music imitations; and
      (iii) a first adaptive threshold generator for generating said first varying threshold value that adapts to a characteristic of the output of said first bandsplit filter;

b) a second processing channel comprising:
   (i) a second bandsplit filter for passing the second tone and providing limited attenuation of said first tone;
   (ii) a second comparator for comparing the amplitude of the output of said second bandsplit filter with a second varying threshold value to reject speech and music imitations; and
   (ii) a second adaptive threshold generator for generating said second varying threshold value that adapts to said characteristic of the output of said second bandsplit filter; and
c) a detect decision circuit for detecting the presence of said alert signal based on the output of said first and second comparators of said first and second processing channels.

2. An apparatus as claimed in claim 1, wherein said characteristic is the average amplitude of the output of said bandsplit filters.

3. An apparatus as claimed in claim 1, further comprising a minimum threshold generator for providing a fixed minimum threshold to said first and second comparators, said first and second varying thresholds being primarily based on said minimum threshold for low amplitudes.

4. An apparatus as claimed in claim 3, wherein said minimum threshold is a time invariant DC signal.

5. An apparatus as claimed in claim 3, which is responsive to a mode control signal and wherein each said adaptive threshold generator generates a fixed threshold for on-hook mode operation.

6. An apparatus as claimed in claim 5, wherein said fixed threshold in on-hook mode is different from the fixed threshold providing said minimum threshold in off-hook mode.

7. An apparatus as claimed in claim 5, which is adapted to operate in on-hook mode when connected to a tip/ring front end amplifier and off-hook mode when connected to a hybrid front end amplifier.

8. An apparatus as claimed in claim 5, which is adapted to operate in off-hook mode when connected to a tip/ring or hybrid front end amplifier.

9. An apparatus as claimed in claim 5, which is adapted to operate in on-hook or off-hook mode when connected to a tip/ring front end amplifier and off hook mode when connected to a hybrid front end amplifier.

10. An apparatus as claimed in claim 1, wherein each said adaptive threshold generator comprises a rectifier, a scale factor amplifier, a low pass filter, an inverting amplifier, and a multiplexer.

11. An apparatus as claimed in claim 10, wherein each said adaptive threshold generator further comprises a summing amplifier for adding said adaptive threshold to a fixed minimum threshold.

12. An apparatus as claimed in claim 1, wherein said decision detect circuit comprises a timing circuit for determining the on times of tones detected in each said processing channel and comparing them against predetermined timing criteria for identifying a valid alert signal.

13. An apparatus as claimed in claim 12, wherein said timing circuit identifies a valid alert signal in the off hook mode when the on duration of each tone is greater than or equal to a predetermined minimum value and less than or equal to a predetermined maximum value, and the detected tones overlap for a time greater than or equal to said minimum value.

14. An apparatus as claimed in claim 12, wherein said timing circuit identifies a valid alert signal in the on hook mode when the on duration of each tone is greater than or equal to a predetermined minimum value and the detected tones overlap for a time greater than or equal to said minimum value.

15. An apparatus as claimed in claim 13, wherein said timing circuit comprises a pair of retriggerable monostable multivibrators for generating a pulse signal corresponding to the duration of a square wave signal, and a guardtime circuit for determining whether the duration of the detected tones falls within a predetermined range.

16. An apparatus as claimed in claim 1, wherein each processing channel further comprises a circuit for determining whether the signal frequency at the output of the bandsplit filter falls within a target range.

17. An apparatus as claimed in claim 16, wherein said circuit includes an amplitude comparator, level shifter, and postlimit filter.

18. An apparatus as claimed in claim 17, wherein said postlimit filter is a high Q bandpass filter whose peak gain is at the nominal frequency of the processing channel.

19. An apparatus as claimed in claim 1, in further comprising a prefilter for boosting the amplitude of frequencies between said first and second tones.

20. An apparatus as claimed in claim 19, wherein said prefilter is common to both said processing channels.

21. An apparatus for detecting an alert signal containing first and second tones in a telephone system capable of off hook mode operation comprising:
   a) a prefilter for boosting frequencies between said first and second tones;
   b) a first processing channel for detecting said first tone comprising:
      (i) a bandsplit filter for passing said first tone and providing limited attenuation of said second tone;
      (ii) a first comparator for comparing the output of said first bandsplit filter with a first varying threshold value to reject speech and music imitations; and
      (iii) a first adaptive threshold generator for generating said first varying threshold value that adapts to a characteristic of the output of said first bandsplit filter;
   c) a second processing channel for detecting said second tone comprising:
      (i) a second bandsplit filter for passing the second tone and providing limited attenuation of said first tone;
      (ii) a second comparator for comparing the amplitude of the output of said second bandsplit filter with a second varying threshold value to reject speech and music imitations; and
      (ii) a second adaptive threshold generator for generating said second varying threshold value that adapts to said characteristic of the output of said second bandsplit filter; and
   d) a timing circuit for determining whether detected tones meet predetermined timing criteria.

22. An apparatus as claimed in claim 21, wherein each processing channel further comprises a circuit for determining whether the signal frequency at the output of the bandsplit filter falls within a target range.

23. An apparatus as claimed in claim 21, wherein said circuit includes an amplitude comparator, a level shifter, and a postlimit filter.

24. A method of detecting a n alert signal containing first and second tones in a received signal in a telephone system capable of caller id off hook mode operation comprising:
   a) passing said received signal to first and second processing channels, said first processing channel having a first bandsplit filter for passing said first tone and providing limited attenuation of said second tone, and said second processing channel having a second bandsplit filter for passing said second tone and providing limited attenuation of said first tone;

b) in each processing channel comparing the output of said bandsplit filters with a varying threshold value that adapts to a characteristic of the output of said bandsplit filter so as to reject speech and music imitations; and c) detecting the presence of an alert signal in said received signal based on the result of said comparison in step b.

25. A method as claimed in claim 24, wherein said characteristic is the average amplitude of the output of the bandsplit filter, and signals with instantaneous amplitudes lower than said varying threshold are rejected.

26. A method as claimed in claim 24, wherein for on-hook operation, said threshold is a fixed minimum threshold.

27. A method as claimed in claim 24, wherein said minimum threshold is a time invariant DC signal.

28. A method as claimed in claim 27, wherein said minimum threshold is different for on and off hook modes of operation.

29. A method as claimed in claim 24, which operates in on-hook mode when connected to a tip/ring front end amplifier and off-hook mode when connected to a hybrid front end amplifier.

30. A method as claimed in claim 24, which operates in off-hook mode when connected to a tip/ring or hybrid front end amplifier.

31. A method as claimed in claim 24, which operates in on-hook or off-hook mode when connected to a tip/ring front end amplifier and off hook mode when connected to a hybrid front end amplifier.

32. A method as claimed in claim 24, wherein the duration of each detected tone is determined and compared with predetermined timing criteria to identify a valid alert signal.

33. A method as claimed in claim 32, wherein a valid alert signal is identified in the off hook mode when the on duration of each tone is greater than or equal to a predetermined minimum value and less than or equal to a predetermined maximum value, and the detected tones overlap for a time greater than or equal to the predetermined minimum value.

34. A method as claimed in claim 32, wherein a valid alert signal is identified in the on hook mode when the on duration of each tone is greater than or equal to a predetermined minimum and the detected tones overlap for a time greater than or equal to the predetermined minimum value.

* * * * *